United States Patent
Hidaka

(10) Patent No.: US 9,379,424 B2
(45) Date of Patent: Jun. 28, 2016

(54) COMPENSATION FOR LENGTH DIFFERENCES IN VIAS ASSOCIATED WITH DIFFERENTIAL SIGNALING

(71) Applicant: FUJITSU LIMITED, Kawasaki-shi, Kanagawa (JP)

(72) Inventor: Yasuo Hidaka, Cupertino, CA (US)

(73) Assignee: FUJITSU LIMITED, Kawasaki (JP)

( * ) Notice: Subject to any disclaimer, the term of this patent is extended or adjusted under 35 U.S.C. 154(b) by 11 days.

(21) Appl. No.: 14/273,167

(22) Filed: May 8, 2014

(65) Prior Publication Data

US 2015/0325901 A1  Nov. 12, 2015

(51) Int. Cl.
*H05K 3/40* (2006.01)
*H01P 3/08* (2006.01)
*G06F 17/50* (2006.01)
*H01P 11/00* (2006.01)

(52) U.S. Cl.
CPC .............. *H01P 3/08* (2013.01); *G06F 17/5009* (2013.01); *G06F 17/5081* (2013.01); *H01P 11/003* (2013.01); *H05K 3/40* (2013.01); *Y10T 29/49156* (2015.01)

(58) Field of Classification Search
CPC ...................................................... H05K 1/115
USPC ........................................................ 174/261
See application file for complete search history.

(56) References Cited

U.S. PATENT DOCUMENTS

| | | | | |
|---|---|---|---|---|
| 6,303,875 B1* | 10/2001 | Hata | ................. | H01L 23/49838 174/260 |
| 6,396,000 B1* | 5/2002 | Baum | ................. | H05K 1/0228 174/261 |
| 2003/0150643 A1* | 8/2003 | Juntwait | ............. | H05K 1/0228 174/261 |
| 2009/0315158 A1* | 12/2009 | Maetani | ............... | H05K 1/0245 257/664 |
| 2012/0034822 A1* | 2/2012 | Bopp | ................. | H01R 13/6469 439/676 |

* cited by examiner

*Primary Examiner* — Chau N Nguyen
(74) *Attorney, Agent, or Firm* — Maschoff Brennan

(57) ABSTRACT

A circuit may include a differential via that may include a first via having a first-via length and a second via having a second-via length longer than the first-via length. The circuit may also include a differential stripline coupled to the differential via. The differential stripline may include a first trace and a second trace that are broadside coupled to each other over at least a portion of the differential stripline to form a broadside coupled portion of the differential stripline. The first trace may be coupled to the first via and may have a first-trace length. The second trace may be coupled to the second via and may have a second-trace length. The broadside coupled portion of the differential stripline may be offset from a plane intersecting substantially half-way between the first via and the second via such that the second-trace length is shorter than the first-trace length.

18 Claims, 7 Drawing Sheets

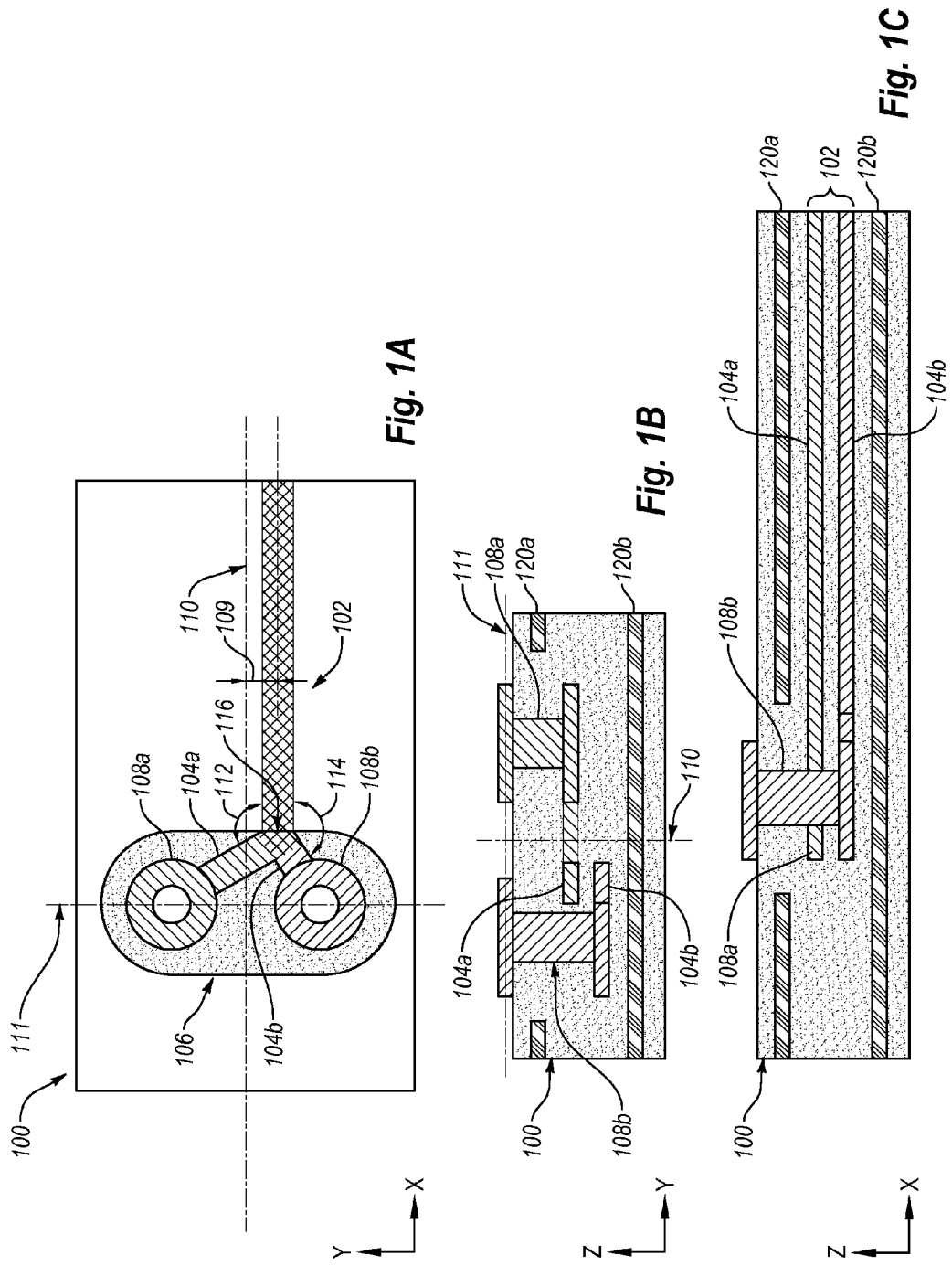

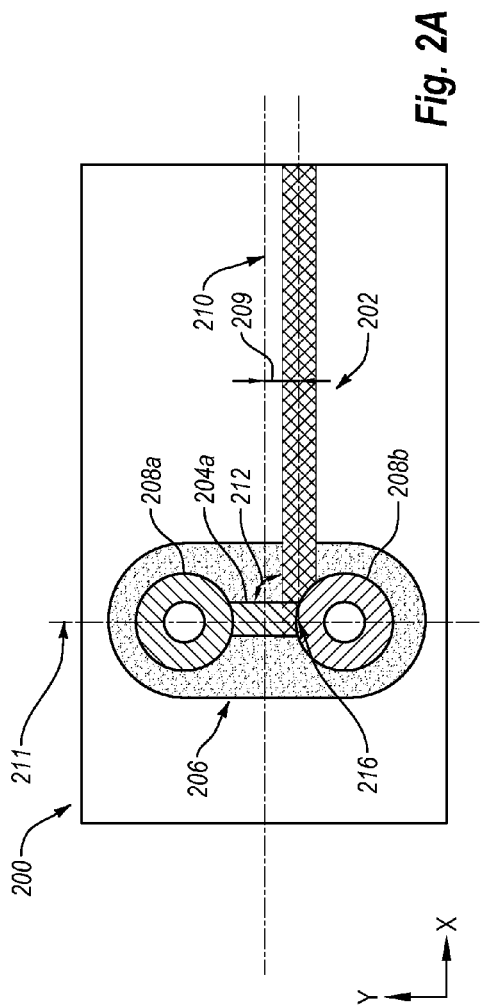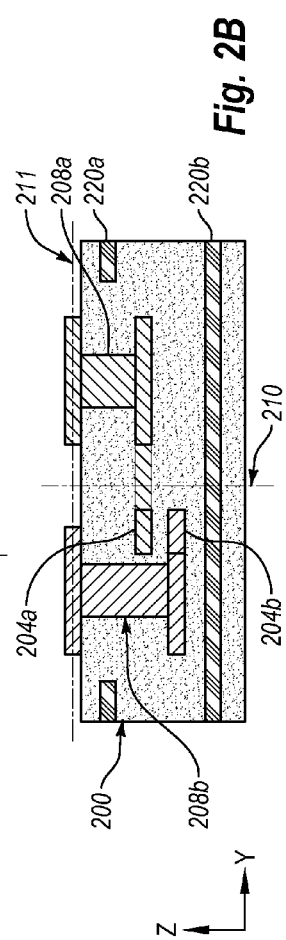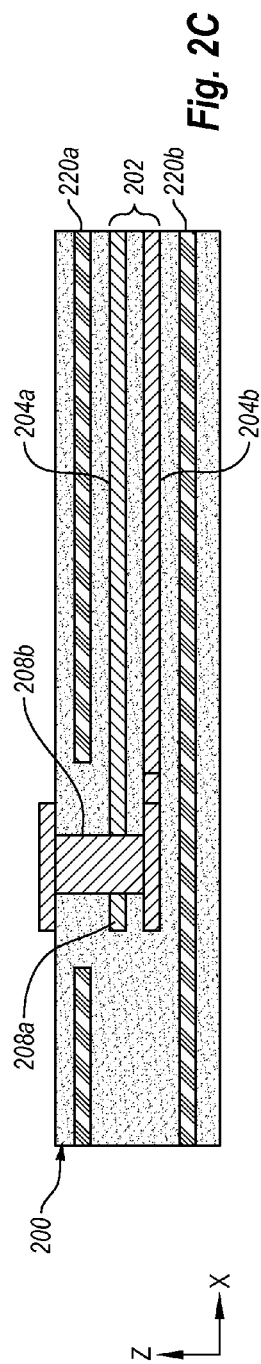

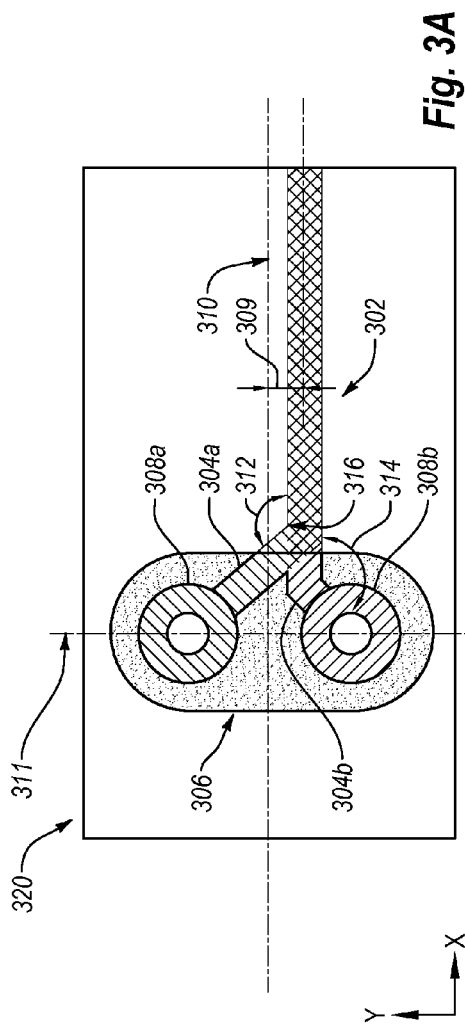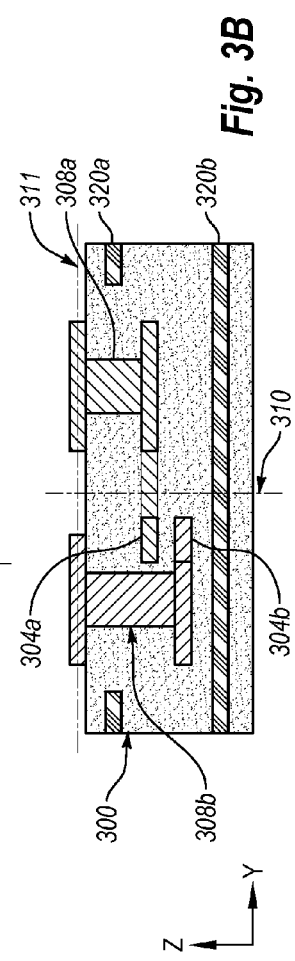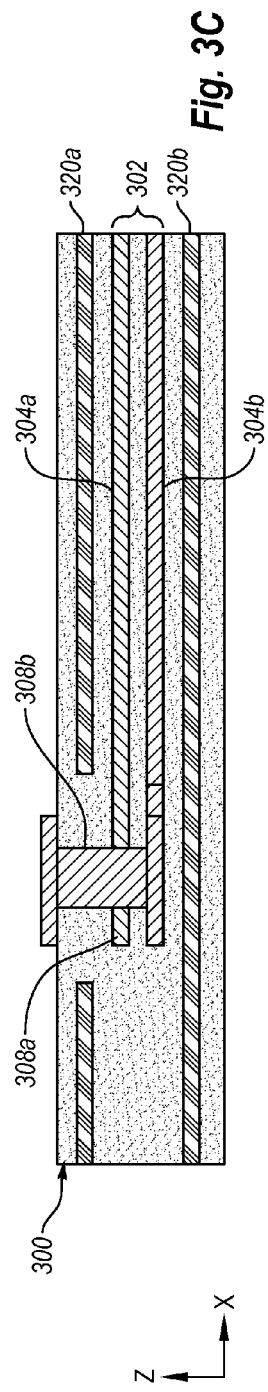

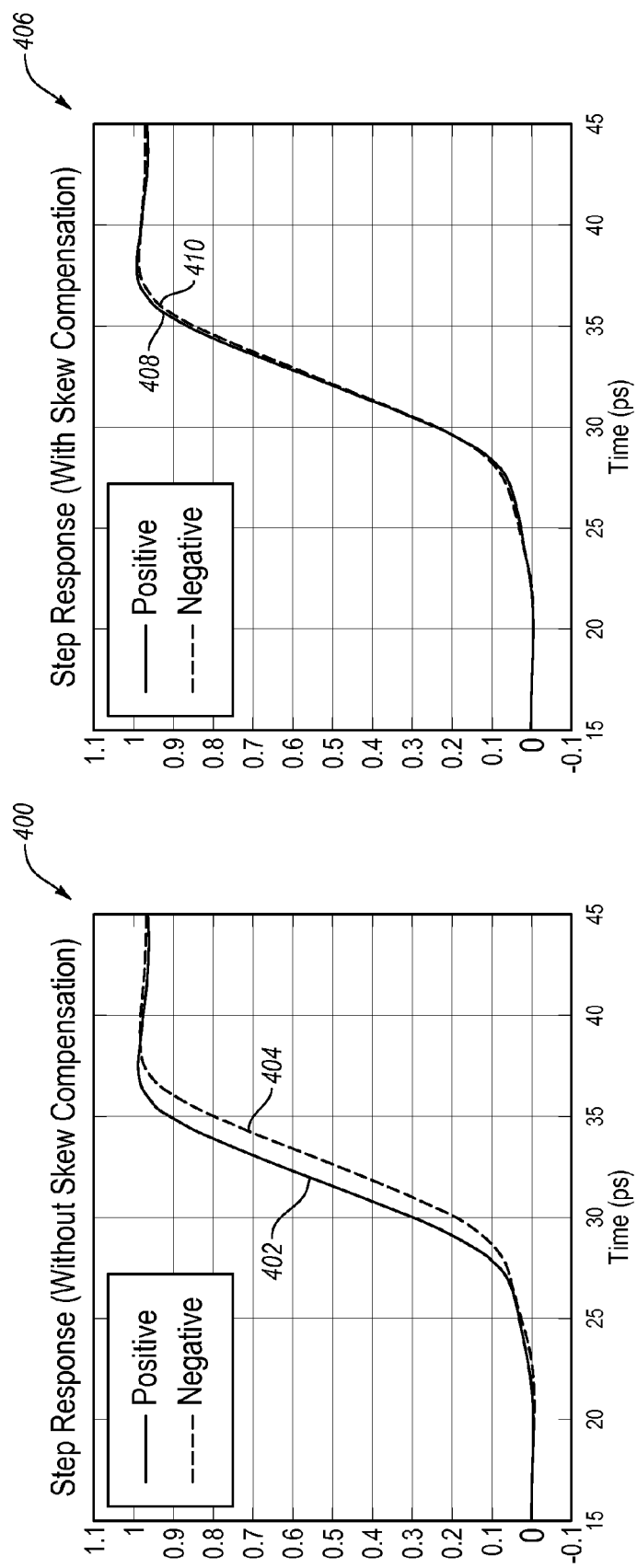

COMPENSATION FOR LENGTH DIFFERENCES IN VIAS ASSOCIATED WITH DIFFERENTIAL SIGNALING

FIELD

The embodiments discussed herein are related to compensation of length differences in vias associated with differential signaling.

BACKGROUND

A differential signal typically includes two separate signals that are sent along two different signal paths. Information is read from and written to a differential signal based on comparisons between the two separate signals. The two different signal paths traversed by the two signals in a differential signal may be separate traces on or in a circuit board. When the paths are different lengths, a skew may occur between the two signals associated with the differential signal, which may cause signal degradation. The amount of skew caused by different path lengths may be increased when the frequency of the differential signal is increased.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may include a differential via configured to carry a differential signal. The differential via may include a first via and a second via. The first via may have a first-via length and the second via may have a second-via length longer than the first-via length. A first plane may intersect the differential via substantially half-way between the first via and the second via. The first plane may be substantially perpendicular to a second plane intersecting a first center of the first via and a second center of the second via. The circuit may also include a differential stripline coupled to the differential via and configured to carry the differential signal. The differential stripline may include a first trace and a second trace that are broadside coupled to each other over at least a portion of the differential stripline to form a broadside coupled portion of the differential stripline. The first trace may be coupled to the first via and may have a first-trace length between the broadside coupled portion of the differential stripline and the first via. The second trace may be coupled to the second via and may have a second-trace length between the broadside coupled portion of the differential stripline and the second via. The broadside coupled portion of the differential stripline may be offset from the first plane such that the second-trace length is shorter than the first-trace length.

The object and advantages of the embodiments will be realized and achieved at least by the elements, features, and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which:

FIG. 1A illustrates a top-view of an example configuration of a circuit configured to reduce skew in a differential signal;

FIG. 1B illustrates a profile-view of the circuit of FIG. 1A;

FIG. 1C illustrates another profile-view of the circuit of FIGS. 1A and 1B;

FIG. 2A illustrates a top-view of an example configuration of another circuit configured to reduce skew in a differential signal;

FIG. 2B illustrates a profile-view of the circuit of FIG. 2A;

FIG. 2C illustrates another profile-view of the circuit of FIGS. 2A and 2B;

FIG. 3A illustrates a top-view of an example configuration of another circuit configured to reduce skew in a differential signal;

FIG. 3B illustrates a profile-view of the circuit of FIG. 3A;

FIG. 3C illustrates another profile-view of the circuit of FIGS. 3A and 3B;

FIG. 4A illustrates an example graph of a step response of a differential signal within a circuit that does not have skew compensation as taught herein;

FIG. 4B illustrates an example graph of a step response of a differential signal within a circuit that does have skew compensation as taught herein;

DESCRIPTION OF EMBODIMENTS

Figure 6:
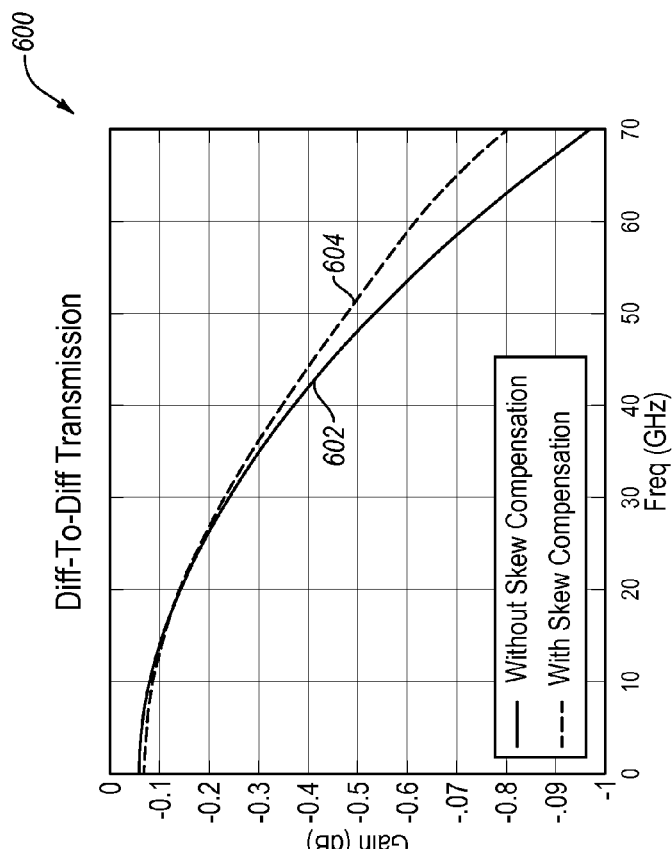
FIG. 6 illustrates a graph that indicates differential-to-differential transmissions of differential signals.

In a circuit board, two signals associated with a differential signal may be transmitted along separate paths of the circuit board. When the paths are different lengths, a skew may occur between the two signals associated with the differential signal, which may cause signal degradation. The skew caused by different path lengths may increase insertion loss of the differential signal when the frequency of the differential signal is increased.

According to at least one embodiment of the present disclosure, a circuit may be configured to carry a differential signal. The circuit may include a differential stripline that may include a first trace and a second trace. The first trace may be configured to carry a first signal (e.g., a positive signal) of the differential signal and the second trace may be configured to carry a second signal (e.g., a negative signal) of the differential signal. At least a portion of the first and second traces may be broadside coupled such that the differential stripline may have at least a portion that is broadside coupled. The terms "broadside coupling" or "broadside coupled" may refer to traces that run parallel to each other on adjacent different layers of a circuit board where at least a portion of the trace on the lower layer is underneath the trace on the upper layer. Additionally, the term "differential stripline" may refer to a set of traces (e.g, the first trace and the second trace) that may be configured to carry a differential signal.

The circuit may also include a differential via, which may include a first via and a second via. The first via may be coupled to the first trace and the second via may be coupled to the second trace. Vias may be used to electrically connect conductors in different layers of circuit boards and integrated circuits. Accordingly, the first via may be configured to carry the first signal of the differential signal from the first trace to another layer of the circuit board or to the first trace from the other layer. The second via may be similarly configured to carry the second signal of the differential signal from the second trace to another layer of the circuit board or to the second trace from the other layer. The term "differential via" may refer to a set of vias (e.g., the first via and the second via) that may be configured to carry a differential signal. A length of a via may refer to a distance between two conductor layers which are electrically connected by the via. A via may have a stub that is a portion of the via outside the two conductor layers which are electrically connected by the via. In the present disclosure, a length of a via may not include a stub of the via.

In some embodiments, the first via and the second via of the differential via may be different lengths. As mentioned above, differing lengths of paths that carry two signals associated with a differential signal may cause skew and/or degradation of the differential signal. In at least one embodiment of the present disclosure, the broadside coupled portion of the differential stripline may be offset from a plane that intersects the differential via approximately half-way between the first via and the second via of the differential via. In some embodiments, the offset may be such that the lengths of the first and second traces are different by approximately the same degree as the difference in the lengths of the first and second vias. Therefore, the paths followed by the first and second signals of the differential signal may be approximately equal in length, which may reduce skew and/or degradation of the differential signal. For example, in some embodiments, the skew reduction may suppress a mode conversion of the differential signal (e.g., a conversion from a differential mode to a common mode or vice versa). Additionally, the skew reduction may reduce an insertion loss of differential mode components of the differential signal.

Embodiments of the present disclosure will be explained with reference to the accompanying drawings.

FIG. 1A illustrates a top-view of an example configuration of a circuit 100 configured to reduce skew in a differential signal, according to at least one embodiment disclosed herein. FIG. 1B illustrates a profile-view of the circuit 100, according to at least one embodiment disclosed herein. FIG. 1C illustrates another profile-view of the circuit 100, according to at least one embodiment disclosed herein. A Cartesian coordinate system is used to help understand the perspectives of the views illustrated in FIGS. 1A-1C, but is not meant to be limiting. For example, the top-view of FIG. 1A illustrates the circuit 100 with respect to an XY plane of a Cartesian coordinate system, the profile-view of FIG. 1B illustrates the circuit 100 with respect to a YZ plane of the same Cartesian coordinate system, and the profile-view of FIG. 1C illustrates the circuit 100 with respect to an XZ plane of the same Cartesian coordinate system.

The circuit 100 may be a layered circuit such as a Printed Circuit Board (PCB) or an Integrated Circuit (IC) or an IC Package that may include more than one layer. The layers of the circuit 100 may be stacked on top of each other. The number of depicted layers of the circuit 100 is merely an example and a circuit configured according to the present disclosure may have any number of applicable layers. Of note, the top-view of FIG. 1A depicts elements of the circuit 100 that may be included on different layers of the circuit 100 and is not meant to illustrate the top-view of a single layer, or every element included at one or more of the layers.

The circuit 100 may include a differential stripline 102 that may include a first trace 104a and a second trace 104b. The first trace 104a may be configured to carry a first signal (e.g., a positive signal) of a differential signal and the second trace 104b may be configured to carry a second signal (e.g., a negative signal) of the differential signal. The circuit 100 may also include a differential via 106 that may include a first via 108a and a second via 108b. The first via 108a may be coupled to the first trace 104a and the second via 108b may be coupled to the second trace 104b such that the first via 108a may be associated with the first signal of the differential signal and the second via 108b may be associated with the second signal of the differential signal. As illustrated in FIGS. 1B and 1C, in some embodiments, the first via 108a and the second via 108b may have different lengths. For example, in the illustrated embodiment, the first via 108a may be shorter than the second via 108b.

As illustrated in FIGS. 1A-1C, the first trace 104a and the second trace 104b may be broadside coupled to each other over at least a portion of the differential stripline 102. For example, the first trace 104a and the second trace 104b may be disposed between a first ground plane 120a and a second ground plane 120b. Additionally, the first trace 104a may be disposed at a layer of the circuit 100 and the second trace 104b may be disposed at another layer of the circuit 100 in a manner such that at least a portion of the second trace 104b is underneath the first trace 104a and runs substantially parallel to the first trace 104a. The portion of the differential stripline 102 where the first trace 104a and the second trace 104b are broadside coupled may be referred to as the "broadside coupled portion" of the differential stripline 102. The part of the differential stripline 102 where the first trace 104a and the second trace 104b branch out toward their respective vias 108 such that they begin to cease to be broadside coupled may be referred to as the "branching point 116" of the differential stripline 102.

As illustrated in FIGS. 1A and 1B, the broadside coupled portion may be offset from a plane 110 by an offset 109. The broadside coupled portion may run substantially parallel to the plane 110 in these or other embodiments. The plane 110 may intersect the differential via 106 half-way between the first via 108a and the second via 108b. Additionally, as illustrated in FIGS. 1A and 1B, the plane 110 may be substantially perpendicular to a plane 111 that may pass through a first center of the first via 108a and a second center of the second via 108b. The planes 110 and 111 may not be actual components of the circuit 100, but are merely used to indicate reference planes associated with the circuit 100.

As illustrated in FIGS. 1A and 1B, the offset 109 may be such that the differential stripline 102 may be closer to the second via 108b than the first via 108a. Therefore, the distance to the first via 108a from the branching point 116 may be further than the distance to the second via 108b from the branching point 116.

Accordingly, the first trace 104a may be longer than the second trace 104b and, as mentioned earlier, the first via 108a may be shorter than the second via 108b. Therefore, the offset 109 of the differential stripline 102 may be configured such that skew or degradation of the differential signal may be reduced. In these and other embodiments, the magnitude of the offset 109, the location and configuration of the branching point 116, the shape of the first trace 104a from the branching point 116 to the first via 108a, and/or the shape of the second trace 104b from the branching point 116 to the second via 108b may be configured to reduce skew or signal degradation.

For example, in some embodiments, the magnitude of the offset 109 and the location of the branching point 116 may be configured such that the first trace 104a is longer than the second trace 104b by approximately the same amount that the second via 108b is longer than the first via 108a. Therefore, the overall lengths of the paths followed by the first and second signals of the differential signal along the first and second traces 104a and 104b and the first and second vias 108a and 108b may be approximately equal to each other. The overall lengths of the paths being approximately equal may reduce skew and degradation in the differential signal caused by mode conversion and/or insertion loss.

As another example, as illustrated in FIG. 1A, the location of the branching point 116 and the shape of the first trace 104a may be configured such that the first trace 104a veers away from the branching point 116 at a first angle 112 and in a substantially straight line toward the first via 108a. Additionally, the location of the branching point 116 and the shape of the second trace 104b may be configured such that the second trace 104b veers away from the branching point 116 at a second angle 114 and in a substantially straight line toward the second via 108b in which the second angle 114 may be greater than the first angle 112. The increase of the second angle 114 may reduce impedance discontinuity associated with the second angle 114.

Further, in some embodiments, the location of the branching point 116, the magnitude of the offset 109, and/or the shapes of the first trace 104a and the second trace 104b may be configured such that a portion of the differential stripline 102 that is not broadside coupled is reduced or minimized. The broadside coupling may help to maintain a transverse electromagnetic mode ("TEM Mode") of the first and second signals of the differential signal, which may help to maintain the same speeds and impedances for the first and second signals. Accordingly, reducing or minimizing the portion of the differential stripline 102 that is not broadside coupled may also reduce skew and signal degradation of the differential signal.

Additionally, the configuration of the location of the branching point 116 and shapes of the first trace 104a and the second trace 104b described above may reduce the number of impedance discontinuity points of the differential stripline 102. For example, the shapes of the first trace 104a and the second trace 104b from the branching point 116 may be straight lines. Therefore, impedance discontinuities of the first trace 104a and the second trace 104b, as illustrated, may be limited to the branching point 116 and where they interface with their respective vias 108.

Therefore, the configurations of the offset 109, the branching point 116, the first trace 104a, and the second trace 104b may maintain substantially the same path length for the first and second signals of the differential signal when the lengths of the vias 108 are different while reducing or minimizing impedance discontinuities. In contrast, traditional implementations of broadside coupled differential striplines and/or methods of maintaining the same path length for two signals of a differential signal (e.g., a meander line) may introduce impedance discontinuities and/or different path lengths.

Modifications may be made to FIGS. 1A-1C without departing from the scope of the present disclosure. For example, the circuit 100 may include any number of layers, differential vias, and/or differential striplines as well as any other suitable elements. Additionally, the vias 108 in the circuit 100 may have via stubs which may be omitted in FIGS. 1A-1C. Further, the depictions of the circuit 100 in FIGS. 1A-1C are merely used to illustrate the concepts described herein and are not necessarily schematically accurate. Additionally, the paths and/or configurations of the differential stripline 102 and the differential via 106 may vary. For example, FIGS. 2A-2C, 3A-3C, below illustrate other example configurations of offsets, branching points, and shapes of traces.

FIG. 2A illustrates a top-view of an example configuration of a circuit 200 configured to reduce skew in a differential signal, according to at least one embodiment disclosed herein. FIG. 2B illustrates a profile-view of the circuit 200, according to at least one embodiment disclosed herein. FIG. 2C illustrates another profile-view of the circuit 200, according to at least one embodiment disclosed herein. As with FIGS. 1A-1C, a Cartesian coordinate system is used to help understand the perspectives of the views illustrated in FIGS. 2A-2C, but is not meant to be limiting. For example, the top-view of FIG. 2A illustrates the circuit 200 with respect to an XY plane of a Cartesian coordinate system, the profile-view of FIG. 2B illustrates the circuit 200 with respect to a YZ plane of the same Cartesian coordinate system, and the profile-view of FIG. 2C illustrates the circuit 200 with respect to an XZ plane of the same Cartesian coordinate system.

The circuit 200 may be a layered circuit such as a Printed Circuit Board (PCB) or an Integrated Circuit (IC) or an IC Package that may include more than one layer. The layers of the circuit 200 may be stacked on top of each other. The number of depicted layers of the circuit 200 is merely an example and a circuit configured according to the present disclosure may have any number of applicable layers. Additionally, as with the top-view of FIG. 1A, the top-view of FIG. 2A depicts elements of the circuit 200 that may be included on different layers of the circuit 200 and is not meant to illustrate the top-view of a single layer, or every element included at one or more of the layers.

The circuit 200 may include a differential stripline 202 that may include a first trace 204a and a second trace 204b. The first trace 204a may be configured to carry a first signal (e.g., a positive signal) of a differential signal and the second trace 204b may be configured to carry a second signal (e.g., a negative signal) of the differential signal. The circuit 200 may also include a differential via 206 that may include a first via 208a and a second via 208b. The first via 208a may be coupled to the first trace 204a and the second via 208b may be coupled to the second trace 204b such that the first via 208a may be associated with the first signal of the differential signal and the second via 208b may be associated with the second signal of the differential signal. As illustrated in FIGS. 2B and 2C, in some embodiments, the first via 208a and the second via 208b may have different lengths. For example, in the illustrated embodiment, the first via 208a may be shorter than the second via 208b.

The first trace 204a and the second trace 204b may be disposed between a first ground plane 220a and a second ground plane 220b. Similar to the first trace 104a and the second trace 104b of FIGS. 1A-1C, the first trace 204a and the second trace 204b may be broadside coupled to each other over at least a portion of the differential stripline 202, which may be referred to as the "broadside coupled portion" of the differential stripline 202. Additionally, similar to the differential stripline 102 of FIGS. 1A-1C, the part of the differential stripline 202 where the first trace 204a and the second trace 204b branch out toward their respective vias 208 may be referred to as the "branching point 216" of the differential stripline 202.

Similar to the differential stripline 102 of FIGS. 1A-1C, the broadside coupled portion of the differential stripline 202 may be offset from a plane 210 that is substantially perpendicular to a plane 211 by an offset 209 as illustrated in FIG. 2A. Additionally, similar to the offset 109 of FIG. 1A, the offset 209 may be such that the differential stripline 209 may be closer to the second via 208b than the first via 208a. Therefore, the length of the first trace 204a to the first via 208a from the branching point 216 may be longer than the length of the second trace 204b to the second via 208b from the branching point 216.

The magnitude of the offset 209, the location of the branching point 216, the shape of the first trace 204a from the branching point 216 to the first via 208a, and/or the shape of the second trace 204b from the branching point 216 to the second via 208b may be configured to reduce skew or signal degradation. For example, in the illustrated embodiment of FIG. 2A, the broadside coupled portion of the differential stripline 202 may continue until the plane 211 that may run through a first center of the first via 208a and a second center of the second via 208b. Therefore, the location of the branching point 216 may be on the plane 211, which may reduce or minimize the portion of the differential stripline 202 that is not broadside coupled.

Additionally, in these or other embodiments, the magnitude of the offset 209 may be configured such that the length of the first trace 204a from the branching point 216 to the first via 208a may be longer than the length of the second trace 204b from the branching point 216 to the second via 208b by approximately the same amount as the difference in length between the first via 208a and the second via 208b. In some embodiments, the length of the second trace 204b from the branching point 216 to the second via 208b may be so short that the second trace 204b from the branching point 216 to the second via 208b may be integrated with the second via 208b. Therefore, the path travelled by the first signal of the differential signal may be approximately equal to the path travelled by the second signal of the differential signal to reduce skew and/or degradation resulting from mode conversion and/or insertion loss.

Further, as illustrated in FIG. 2A, the shape of the first trace 204a may be configured as a straight line from the branching point 216, which may reduce or minimize impedance discontinuities in the first trace 204a. Therefore, the configuration illustrated in FIG. 2A may limit impedance discontinuities of the first trace 204a depicted in FIG. 2A to the branching point 216 and the interface of the first trace 204a with the first via 208a. Additionally, configuring the second trace 204b from the branching point 216 to the second via 208b as a straight line or integrated with the second via 208b may also reduce or minimize impedance discontinuities in the second trace 204b. For example, the configuration illustrated in FIG. 2A may limit impedance discontinuities of the second trace 204b to the interface of the second trace 204b with the second via 208b.

Therefore, the configuration of the offset 209, the location of the branching point 216, and the shapes of the first trace 204a and the second trace 204b described above may reduce skew or degradation of the differential signal. Modifications may be made to FIGS. 2A-2C without departing from the scope of the present disclosure. For example, the circuit 200 may include any number of layers, differential vias, and/or differential striplines. Additionally, the vias 208 in the circuit 200 may have via stubs which may be omitted in FIGS. 2A-2C. Additionally, the paths and/or configurations of the differential stripline 202 and the differential via 206 may vary. Further, the depictions of the circuit 200 in FIGS. 2A-2C are merely used to illustrate the concepts described herein and are not necessarily schematically accurate.

FIG. 3A illustrates a top-view of an example configuration of a circuit 300 configured to reduce skew in a differential signal, according to at least one embodiment disclosed herein. FIG. 3B illustrates a profile-view of the circuit 300, according to at least one embodiment disclosed herein. FIG. 3C illustrates another profile-view of the circuit 300, according to at least one embodiment disclosed herein. As with FIGS. 1A-1C and 2A-2C, a Cartesian coordinate system is used to help understand the perspectives of the views illustrated in FIGS. 3A-3C, but is not meant to be limiting. For example, the top-view of FIG. 3A illustrates the circuit 300 with respect to an XY plane of a Cartesian coordinate system, the profile-view of FIG. 3B illustrates the circuit 300 with respect to a YZ plane of the same Cartesian coordinate system, and the profile-view of FIG. 3C illustrates the circuit 300 with respect to an XZ plane of the same Cartesian coordinate system.

The circuit 300 may be a layered circuit such as a Printed Circuit Board (PCB) or an Integrated Circuit (IC) or an IC Package that may include more than one layer. The layers of the circuit 300 may be stacked on top of each other. The number of depicted layers of the circuit 300 is merely an example and a circuit configured according to the present disclosure may have any number of applicable layers. Additionally, as with the top-view of FIGS. 1A and 2A, the top-view of FIG. 3A depicts elements of the circuit 300 that may be included on different layers of the circuit 300 and is not meant to illustrate the top-view of a single layer, or every element included at one or more of the layers The circuit 300 may include a differential stripline 302 that may include a first trace 304a and a second trace 304b. The first trace 304a may be configured to carry a first signal (e.g., a positive signal) of a differential signal and the second trace 304b may be configured to carry a second signal (e.g., a negative signal) of the differential signal. The circuit 300 may also include a differential via 306 that may include a first via 308a and a second via 308b. The first via 308a may be coupled to the first trace 304a and the second via 308b may be coupled to the second trace 304b such that the first via 308a may be associated with the first signal of the differential signal and the second via 308b may be associated with the second signal of the differential signal. As illustrated in FIGS. 3B and 3C, in some embodiments, the first via 308a and the second via 308b may have different lengths. For example, in the illustrated embodiment, the first via 308a may be shorter than the second via 308b.

The first trace 304a and the second trace 304b may be disposed between a first ground plane 320a and a second ground plane 320b. Similar to the first trace 104a and the second trace 104b of FIGS. 1A-1C and the first trace 204a and the second trace 204b of FIGS. 2A-2C, the first trace 304a and the second trace 304b may be broadside coupled to each other over at least a portion of the differential stripline 302, which may be referred to as the "broadside coupled portion" of the differential stripline 302. Additionally, similar to the differential stripline 102 of FIGS. 1A-1C and the differential stripline 202 of FIGS. 2A-2C, the part of the differential stripline 302 where the first trace 304a and the second trace 304b branch out toward their respective vias 308 may be referred to as the "branching point 316" of the differential stripline 302.

The broadside coupled portion of the differential stripline 302 may be offset from a plane 310 that is substantially perpendicular to a plane 311 by an offset 309, as illustrated in FIG. 3A. Additionally, similar to the offset 109 of FIG. 1A and the offset 209 of FIG. 2A, the offset 309 may be such that the differential stripline 309 may be closer to the second via 308b than the first via 308a. Therefore, the length of the first trace 304a to the first via 308a from the branching point 316 may be longer than the length of the second trace 304a to the second via 308b from the branching point 316.

Analogous to FIGS. 1A-1C and 2A-2C, the magnitude of the offset 309, the location of the branching point 316, the shape of the first trace 304a from the branching point 316 to the first via 308a, and/or the shape of the second trace 304b from the branching point 316 to the second via 308b may be configured to reduce skew or signal degradation. For example, in the illustrated embodiment of FIG. 3A, the location of the branching point 316 and the shape of the first trace 304a may be configured such that the first trace 304a veers away from the branching point 316 at a first angle 312 and in a substantially straight line toward the first via 308a. As mentioned above, having the first trace 304a veer toward the first via 308a in a substantially straight line may reduce or minimize impedance discontinuities in the first trace 304a. For example, the straight line configuration of the first trace 304a from the branching point 316 to the first via 308a may limit impedance discontinuities of the first trace 304a in the illustrated embodiment to the branching point 316 and the interface of the first trace 304a with the first via 308a.

Additionally, the location of the branching point 316 and the shape of the second trace 304b may be configured such that the second trace 304b continues in the same path after the branching point 316 as before the branching point 316 and then veers toward the second via 308b at an angle 314 shortly before interfacing with the second via 308b. Therefore, the impedance discontinuities of the illustrated portion of the second trace 304b may be limited to a relatively small area that surrounds the interface of the second trace 304b with the second via 308b that also includes the angle 314.

Additionally, the configuration of the branching point 316, the first trace 304a and the second trace 304b may be such that the angle 314 is approximately equal to the first angle 312. Having the angles 312 and 314 approximately equal to each other as depicted may help avoid having a relatively small angle of divergence at the branching point 316, which may also reduce impedance discontinuities.

Further, in these or other embodiments, the magnitude of the offset 309, the shape of the first trace 304a, and/or the shape of the second trace 304b may be configured such that the length of the first trace 304a from the branching point 316 to the first via 308a may be longer than the length of the second trace 304b from the branching point 316 to the second via 308b by approximately the same amount as the difference in length between the first via 308a and the second via 308b. Therefore, the path travelled by the first signal of the differential signal may be approximately equal to the path travelled by the second signal of the differential signal to reduce skew and/or signal degradation resulting from mode conversion and/or insertion loss.

Therefore, the configuration of the offset 309, the location of the branching point 316, and the shapes of the first trace 304a and the second trace 304b described above may reduce skew or degradation of the differential signal. Modifications may be made to FIGS. 3A-3C without departing from the scope of the present disclosure. For example, the circuit 300 may include any number of layers, differential vias, and/or differential striplines. The vias 308 in the circuit 300 may have via stubs which may be omitted in FIGS. 3A-3C. Additionally, the paths and/or configurations of the differential stripline 302 and the differential via 306 may vary. Further, the depictions of the circuit 300 in FIGS. 3A-3C are merely used to illustrate the concepts described herein and are not necessarily schematically accurate.

As mentioned above, configuring a circuit in a manner as described above with respect to FIGS. 1A-1C, 2A-2C, and/or 3A-3C may help reduce skew of a differential signal. FIG. 4A illustrates an example graph 400 of a step response of a first differential signal within a first circuit that does not have skew compensation as taught herein. FIG. 4B illustrates an example graph 406 of a step response of a second differential signal within a second circuit that does have skew compensation, according to at least one embodiment described herein. The graph 400 includes a solid line 402 and a dashed line 404, and the graph 406 includes a solid line 408 and a dashed line 410. The solid lines 402 and 408 illustrate the step responses of positive signals of their respective differential signals. The dashed lines 404 and 410 illustrate the step responses of negative signals of their respective differential signals. As illustrated in the graph 400, the lines 402 and 404 are not aligned throughout the graph 400, thus indicating skew between the positive and negative signals of the first differential signal associated with the graph 400. In contrast, the lines 408 and 410 are substantially aligned throughout the graph 406, thus indicating little to no skew between the positive and negative signals of the second differential signal associated with the graph 406. Therefore, a comparison of the graphs 400 and 406 indicates that configuring a circuit according to the teachings described herein may reduce skew experienced by a differential signal.

Figure 5:
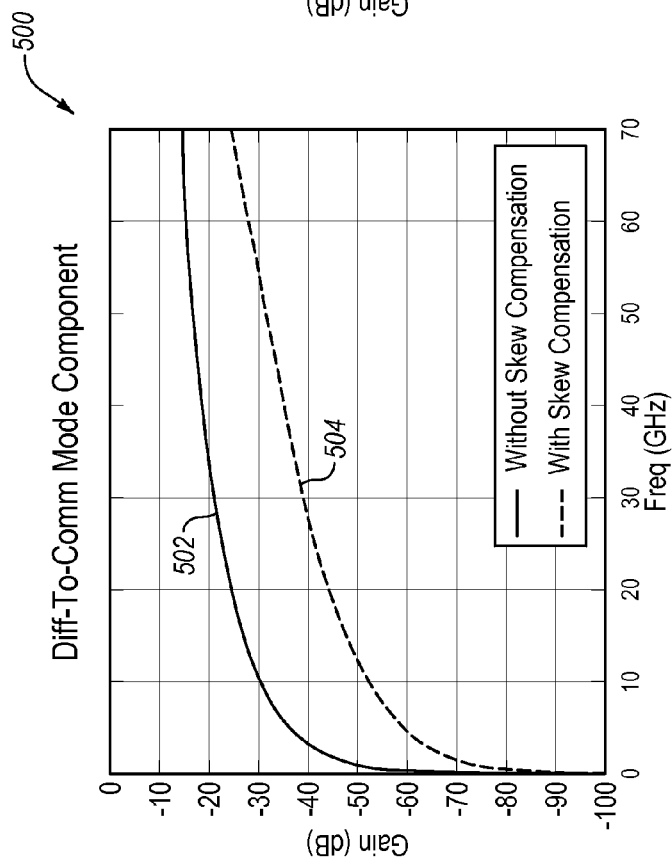
FIG. 5 illustrates a graph that indicates differential-to-common mode components of differential signals.

Further, as also mentioned above, configuring a circuit in a manner as described above with respect to FIGS. 1A-1C, 2A-2C, and/or 3A-3C may help suppress a mode conversion of the differential signal. FIG. 5 illustrates a graph 500 that indicates differential-to-common mode components of differential signals. A solid line 502 indicates a first differential-to-common mode component of a first differential signal associated with a first circuit not configured with skew compensation described herein. A dashed line 504 indicates a second differential-to-common mode component of a second differential signal associated with a second circuit configured with skew compensation described herein. The differential-to-common mode component of a differential signal is related to whether the differential signal may undergo a mode conversion from differential mode to common mode. Therefore, the higher the gain of the differential-to-common mode component, the more likely the differential signal will undergo a mode conversion from differential mode to common mode.

A comparison of the lines 502 and 504 indicates that the first differential-to-common mode component of the first differential signal associated without skew compensation described herein has a higher gain than the second differential-to-common mode component of the second differential signal associated with skew compensation described herein. Accordingly, the graph 500 indicates that the skew compensation described herein may help suppress mode conversion of a differential signal as compared to when the skew compensation is not used.

Additionally, a differential-to-differential transmission of a differential signal is also related to whether the differential signal may undergo a mode conversion from differential mode to common mode. For example, the stronger the differential-to-differential transmission, the more likely the differential signal will stay in a differential mode. FIG. 6 illustrates a graph 600 that indicates differential-to-differential transmissions of differential signals. A solid line 602 indicates a first differential-to-differential transmission of a first differential signal associated with a first circuit not configured with skew compensation described herein. A dashed line 604 indicates a second differential-to-differential transmission of a second differential signal associated with a second circuit configured with skew compensation described herein.

A comparison of the lines 602 and 604 indicates that the first differential-to-differential transmission of the first differential signal has a lower gain over a wide frequency range (e.g., 70 Gigahertz (GHz)) than the second differential-to-differential transmission of the second differential signal. Accordingly, the graph 600 indicates that the skew compensation described herein may help suppress mode conversion of a differential signal as compared to when the skew compensation is not used.

The differential-to-differential transmission of a differential signal may also indicate an insertion loss of the differential signal. As indicated by a comparison of the lines 602 and 604, the higher gain of the second differential-to-differential transmission as compared to the first differential-to-differential transmission also indicates a lower insertion loss of the second differential signal as compared to the first differential signal. A lower insertion loss may also reduce signal degradation of differential signals. Accordingly, the graph 600 also indicates that the skew compensation described herein may help reduce insertion loss of a differential signal as compared to when the skew compensation is not used, which may also reduce signal degradation.

Figure 7:
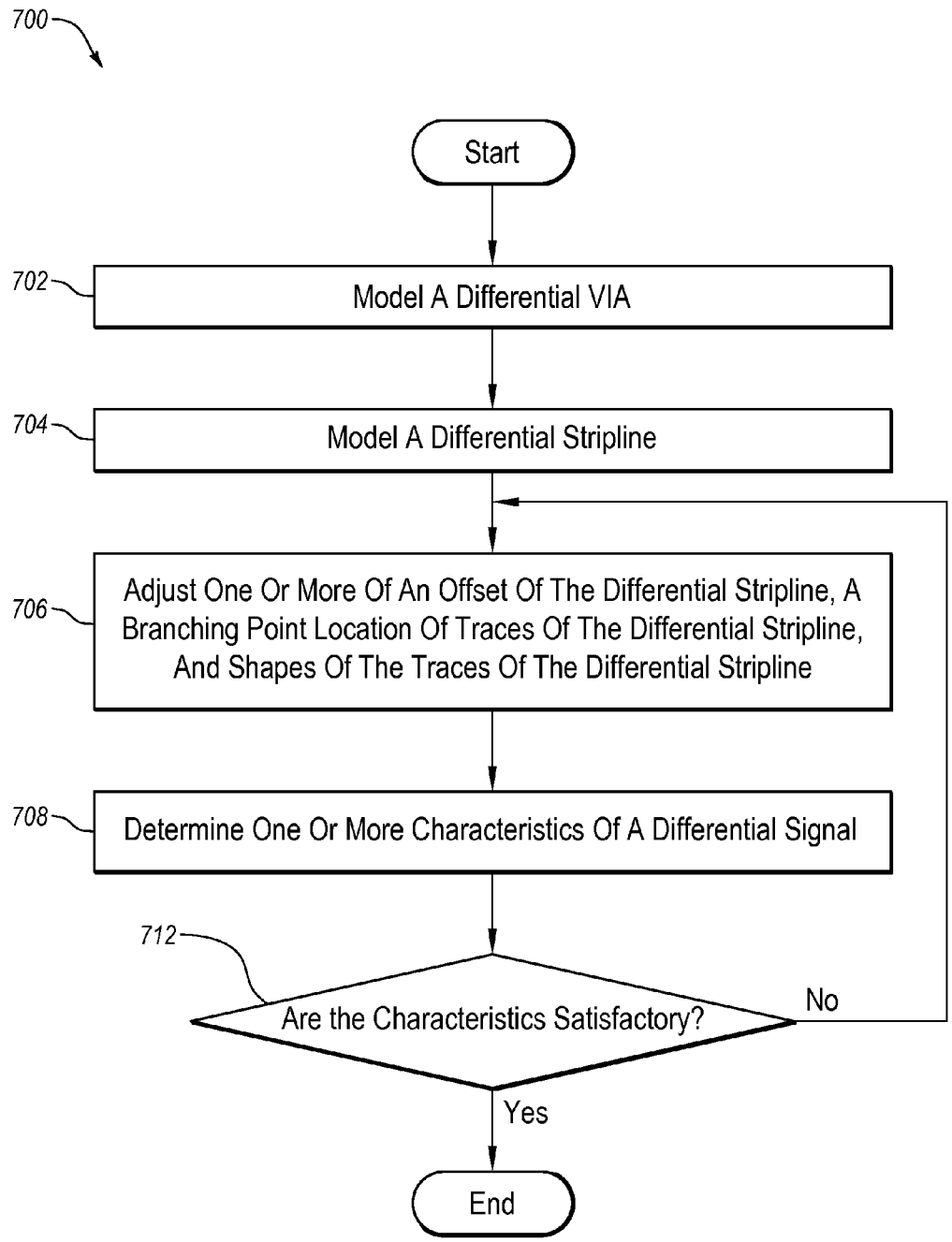
FIG. 7 is a flowchart of an example method of modeling a circuit configured to reduce electrical signal degradation.

FIG. 7 is a flowchart of an example method 700 of modeling a circuit configured to reduce electrical signal degradation, arranged in accordance with at least one embodiment described herein. The method 700 may be implemented, in some embodiments, using any applicable design software stored on a computer-readable storage medium according to the principles described above with respect to the circuits 100, 200, and 300 of FIGS. 1A-1C, 2A-2C, and 3A-3C, respectively. Although illustrated as discrete blocks, various blocks may be divided into additional blocks, combined into fewer blocks, or eliminated, depending on the desired implementation.

The method 700 may begin at block 702 where a differential via configured to carry a differential signal may be modeled. The differential via may include a first via and a second via. The first via may have a first-via length and the second via may have a second-via length that is longer than the first-via length. Additionally, a first plane may intersect the differential via half-way between the first via and the second via. The first plane may be substantially perpendicular to a second plane intersecting a first center of the first via and a second center of the second via. The first plane and the second plane may not be actual components of the differential via but are used merely to denote a frame of reference.

At block 704, a differential stripline configured to carry the differential signal may be modeled. The differential stripline may be coupled to the differential via and may include a first trace and a second trace. The first trace and the second trace may be broadside coupled to each other over at least a portion of the differential stripline. Additionally, the first trace may be coupled to the first via and may have a first-trace length. The second trace may be coupled to the second via and may have a second-trace length.

At block 706, an offset of the differential stripline with respect to the first plane may be adjusted. In these or other embodiments, a branching point location where the first trace and the second trace diverge from the broadside coupled portion of the differential stripline toward the first via and the second via, respectively, may be adjusted. Additionally, in these or other embodiments the shape of the first trace and/or the shape of the second trace may be adjusted at block 706.

In some embodiments, the offset, the branching point configuration, and/or the shapes of the first and second traces may be adjusted to reduce skew of the differential signal. For example, in some embodiments, the offset, the branching point configuration, and/or the shapes of the first and second traces may be adjusted such that a trace-length difference between the second-trace length and the first-trace length is approximately equal to a via-length difference between the second-via length and the first-via length. In these or other embodiments, the offset, the branching point configuration, and/or the shapes of the first and second traces may be adjusted such that a trace-length difference between the second-trace length and the first-trace length at least partially compensates for a via-length difference between the second-via length and the first-via length in a manner that a mode conversion of the differential signal is suppressed.

Further, in some embodiments, the offset, the branching point configuration, and/or the shapes of the first and second traces may be adjusted such that a trace-length difference between the second-trace length and the first-trace length at least partially compensates for a via-length difference between the second-via length and the first-via length in a manner that an insertion loss of the differential signal is reduced.

In some embodiments, the offset, the branching point configuration, and/or the shapes of the first and second traces may be adjusted according to any one of the configurations described above with respect to FIGS. 1A-1C, 2A-C, and 3A-3C. Therefore, in some embodiments, the offset, the branching point configuration, and/or the shapes of the first and second traces may be adjusted at block 706 such that signal degradation may be reduced or minimized.

At block 708, one or more characteristics of a differential signal that may propagate along the modeled differential stripline and the modeled differential via may be determined. For example, length difference, skew, mode conversion, insertion loss and/or return loss characteristics of the differential signal may be determined. The determination of the characteristics may be based on computer simulation such as electromagnetic simulation or empirical equations derived from a measured database. At block 710, it may be determined if the characteristics are satisfactory according to design parameters associated with the circuit being modeled in the method 700. When the characteristics are satisfactory, the method 700 may end. When the characteristics are not satisfactory, the method 700 may return to block 706.

Therefore, modeling a circuit according to the method 700 may be used to produce a circuit with reduced skew of a differential signal of the circuit. Modifications may be made to the method 700 without departing from the scope of the present disclosure. For example, the order of the steps associated with the blocks may be performed in a different order than that presented. Additionally, other blocks or steps may be added to the method 700.

The method 700 described herein may be implemented using computer-readable media for carrying or having computer-executable instructions or data structures stored thereon. For example, the wireless devices and/or access points described above may include computer-readable media having computer-executable instructions or data structures stored thereon for performing the functions and operations described above. Such computer-readable media may be any available media that may be accessed by a general-purpose or special-purpose computer (e.g., a processor). By way of example, and not limitation, such computer-readable media may include a non-transitory or tangible computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, or any other storage medium which may be used to carry or store desired program code in the form of computer-executable instructions or data structures and which may be accessed by a general-purpose or special-purpose computer. Combinations of the above may also be included within the scope of computer-readable media.

Computer-executable instructions include, for example, instructions and data which cause a general-purpose computer, special-purpose computer, or special-purpose processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

Figure 8:
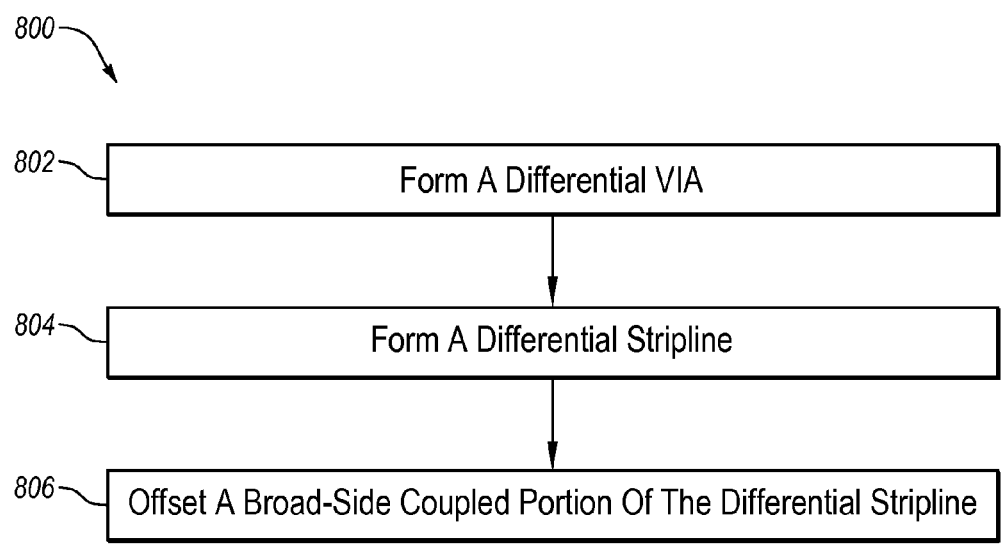
FIG. 8 is a flowchart of an example method of forming a circuit configured to reduce degradation of a differential signal.

FIG. 8 is a flowchart of an example method 800 of forming a circuit configured to reduce degradation of a differential signal, arranged in accordance with at least one embodiment described herein. The method 800 may be implemented, in some embodiments, by forming a circuit according to the principles described above with respect to the circuits 100, 200, and 300 of FIGS. 1A-1C, 2A-2C, and 3A-3C, respectively. Although illustrated as discrete blocks, various blocks may be divided into additional blocks, combined into fewer blocks, or eliminated, depending on the desired implementation.

The method 800 may begin at block 802 where a differential via configured to carry a differential signal may be formed. The differential via may be formed to include a first via and a second via. The first via may have a first-via length and the second via may have a second-via length longer than the first-via length. Additionally, a first plane may intersect the differential via half-way between the first via and the second via. The first plane may be substantially perpendicular to a second plane intersecting a first center of the first via and a second center of the second via. The first plane and the second plane may not be actual components of the differential via or circuit but are used merely to denote a frame of reference.

At block 804, a differential stripline configured to carry the differential signal may be formed. The differential stripline may be formed to couple to the differential via and may include a first trace and a second trace. The first trace and the second trace may be broadside coupled to each other over at least a portion of the differential stripline. Additionally, the first trace may be coupled to the first via and may have a first-trace length. The second trace may be coupled to the second via and may have a second-trace length.

At block 806, when the differential stripline is being formed it may be offset with respect to the first plane. In these or other embodiments, a branching point location where the first-trace and the second trace diverge from the broadside coupled portion of the differential stripline toward the first via and the second via, respectively, may be adjusted. Additionally, the shape of the first trace and/or the shape of the second trace may be configured at block 806.

In some embodiments, the offset, the branching point configuration, and/or the shapes of the first and second traces may be formed to reduce skew of the differential signal. For example, in some embodiments, the offset, the branching point configuration, and/or the shapes of the first and second traces may be formed such that a trace-length difference between the second-trace length and the first-trace length is approximately equal to a via-length difference between the second-via length and the first-via length. In these or other embodiments, the offset, the branching point configuration, and/or the shapes of the first and second traces may be formed such that a trace-length difference between the second-trace length and the first-trace length at least partially compensates for a via-length difference between the second-via length and the first-via length in a manner that a mode conversion of the differential signal is suppressed.

Further, in some embodiments, the offset, the branching point configuration, and/or the shapes of the first and second traces may be formed such that a trace-length difference between the second-trace length and the first-trace length at least partially compensates for a via-length difference between the second-via length and the first-via length in a manner that an insertion loss of the differential signal is reduced.

In some embodiments, the offset, the branching point configuration, and/or the shapes of the first and second traces may be formed according to any one of the configurations described above with respect to FIGS. 1A-1C, 2A-C, and 3A-3C. Therefore, in some embodiments, the circuit may be formed according to the method 800 such that degradation of the differential signal may be reduced or minimized.

Modifications may be made to the method 800 without departing from the scope of the present disclosure. For example, the order of the steps associated with the blocks may be performed in a different order than that presented. Additionally, other blocks or steps may be added to the method 800.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present disclosure have been described in detail, it should be understood that the various changes, substitutions, and alterations could be made hereto without departing from the spirit and scope of the invention.

What is claimed is:

1. A circuit comprising:
a differential via configured to carry a differential signal and including a first via and a second via, the first via having a first-via length and the second via having a second-via length longer than the first-via length, a first plane intersecting the differential via substantially half-way between the first via and the second via, the first plane being substantially perpendicular to a second plane intersecting a first center of the first via and a second center of the second via; and
a differential stripline configured to carry the differential signal and coupled to the differential via, the differential stripline including a first trace and a second trace that are broadside coupled to each other over at least a portion of the differential stripline to form a broadside coupled portion of the differential stripline, the first trace being coupled to the first via and having a first-trace length between the broadside coupled portion of the differential stripline and the first via, the second trace being coupled to the second via and having a second-trace length between the broadside coupled portion of the differential stripline and the second via, a trace-length difference between the second-trace length and the first-trace length being approximately equal to a via-length difference between the second-via length and the first-via length, the broadside coupled portion of the differential stripline being offset from the first plane such that the second-trace length is shorter than the first-trace length.

2. The circuit of claim 1, wherein the trace-length difference between the second-trace length and the first-trace length at least partially compensates for the via-length difference between the second-via length and the first-via length such that a mode conversion of the differential signal is suppressed.

3. The circuit of claim 1, wherein the trace-length difference between the second-trace length and the first-trace length at least partially compensates for the via-length difference between the second-via length and the first-via length such that a skew of the differential signal is reduced.

4. The circuit of claim 1, wherein the broadside coupled portion of the differential stripline continues to the second plane.

5. The circuit of claim 1 wherein the first trace is configured to veer from the broadside coupled portion of the differential stripline at or near a ninety degree angle.

6. The circuit of claim 1, wherein:
the first trace is configured to veer toward the first via at a first angle with respect to the broadside coupled portion of the differential stripline; and
the second trace is configured to veer toward the second via at a second angle with respect to the broadside coupled portion of the differential stripline, the second angle being approximately equal to the first angle.

7. The circuit of claim 1, wherein:
the first trace is configured to veer toward the first via at a first angle with respect to the broadside coupled portion of the differential stripline; and
the second trace is configured to veer toward the second via at a second angle with respect to the broadside coupled portion of the differential stripline, the second angle being larger than the first angle.

8. A method of forming a circuit, the method comprising:
forming a differential via configured to carry a differential signal and including a first via and a second via, the first via having a first-via length and the second via having a second-via length longer than the first-via length, a first plane intersecting the differential via substantially half-way between the first via and the second via, the first plane being substantially perpendicular to a second plane intersecting a first center of the first via and a second center of the second via;
forming a differential stripline configured to carry the differential signal and coupled to the differential via, the differential stripline including a first trace and a second trace that are broadside coupled to each other over at least a portion of the differential stripline to form a broadside coupled portion of the differential stripline, the first trace being coupled to the first via and having a first-trace length between the broadside coupled portion of the differential stripline and the first via, the second trace being coupled to the second via and having a second-trace length between the broadside coupled portion of the differential stripline and the second via; and
offsetting the broadside coupled portion of the differential stripline with respect to the first plane such that the second-trace length is shorter than the first-trace length and such that a trace-length difference between the second-trace length and the first-trace length is approximately equal to a via-length difference between the second-via length and the first-via length.

9. The method of claim 8, further comprising offsetting the broadside coupled portion of the differential stripline with respect to the first plane such that the trace-length difference between the second-trace length and the first-trace length at least partially compensates for the via-length difference between the second-via length and the first-via length in a manner that a mode conversion of the differential signal is suppressed.

10. The method of claim 8, further comprising offsetting the broadside coupled portion of the differential stripline with respect to the first plane such that the trace-length difference between the second-trace length and the first-trace length at least partially compensates for the via-length difference between the second-via length and the first-via length in a manner that a skew of the differential signal is reduced.

11. The method of claim 8, further comprising configuring the broadside coupled portion of the differential stripline to continue to the second plane.

12. The method of claim 8, further comprising configuring the first trace to veer from the broadside coupled portion of the differential stripline at or near a ninety degree angle.

13. The method of claim 8, further comprising:
configuring the first trace to veer toward the first via at a first angle with respect to the broadside coupled portion of the differential stripline; and
configuring the second trace to veer toward the second via at a second angle with respect to the broadside coupled portion of the differential stripline, the second angle being approximately equal to the first angle.

14. The method of claim 8, further comprising:
configuring the first trace to veer toward the first via at a first angle with respect to the broadside coupled portion of the differential stripline; and
configuring the second trace to veer toward the second via at a second angle with respect to the broadside coupled portion of the differential stripline, the second angle being larger than the first angle.

15. A method of designing a circuit, the method comprising:
modeling a differential via configured to carry a differential signal and including a first via and a second via, the first via having a first-via length and the second via having a second-via length longer than the first-via length, a first plane intersecting the differential via substantially half-way between the first via and the second via, the first plane being substantially perpendicular to a second plane intersecting a first center of the first via and a second center of the second via;
modeling a differential stripline configured to carry the differential signal and coupled to the differential via, the differential stripline including a first trace and a second trace that are broadside coupled to each other over at least a portion of the differential stripline to form a broadside coupled portion of the differential stripline, the first trace being coupled to the first via and having a first-trace length between the broadside coupled portion of the differential stripline and the first via, the second trace being coupled to the second via and having a second-trace length between the broadside coupled portion of the differential stripline and the second via; and
offsetting the broadside coupled portion of the differential stripline with respect to the first plane such that the second-trace length is shorter than the first-trace length and such that a trace-length difference between the second-trace length and the first-trace length is approximately equal to a via-length difference between the second-via length and the first-via length.

16. The method of claim 15, further comprising adjusting a branching point location where the first trace and the second trace diverge from the broadside coupled portion of the differential stripline to the differential via.

17. The method of claim 15 further comprising one or more of the following: adjusting a first shape of the first trace between a branching point location and the first via and adjusting a second shape of the second trace between the branching point location and the second via, the branching point location being where the first trace and the second trace diverge from the broadside coupled portion of the differential stripline to the differential via.

18. The method of claim 15, wherein offsetting the broadside coupled portion of the differential stripline is based on one or more of a mode conversion characteristic, a skew characteristics and an insertion loss characteristic of the differential signal.

* * * * *